Nov. 8, 1955 S. STEINITZ 2,723,373

MAGNETIC AMPLIFIER FOR POWER TRANSMISSION

Filed April 25, 1950 2 Sheets-Sheet 1

INVENTOR.
STEPHAN STEINITZ
BY Ralph L. Tweedale
ATTORNEY

Nov. 8, 1955 S. STEINITZ 2,723,373
MAGNETIC AMPLIFIER FOR POWER TRANSMISSION
Filed April 25, 1950 2 Sheets-Sheet 2

*INVENTOR.*
STEPHAN STEINITZ.
*BY* Ralph L. Tweedale
ATTORNEY 2,723,373

MAGNETIC AMPLIFIER FOR POWER TRANSMISSION

Stephan Steinitz, St. Louis, Mo., assignor to Vickers Incorporated, Detroit, Mich., a corporation of Michigan Application April 25, 1950, Serial No. 157,992

8 Claims. (Cl. 323—89)

This invention relates to magnetic amplifiers, and more particularly to magnetic amplifiers of the push-pull type having outputs which vary in amplitude and direction in accordance with the amplitude and sense of the input signal.

Such a push-pull magnetic amplifier consists, ordinarily, of two symmetrically built sections which respond in opposite sense to an input signal, the output of one section increasing while that of the other is decreasing. At zero signal, the outputs of both sections are substantially equal but opposite to each other so that the net average useful output in the load is zero. Generally, each section of the push-pull amplifier operates into a separate resistive auxiliary load, and the useful output of the amplifier is due to the potential difference between these auxiliary loads. Obviously, the necessity of auxiliary loads impairs the efficiency of the amplifier. It is desirable, therefore, to have a single output load which is common to both sections of a push-pull amplifier, thus eliminating the necessity of the power wasting auxiliary loads. Generally, in order to accomplish this, it has been found necessary to provide an electrical center at the input power supply or in the amplifier output circuit, for example, a center-tapped transformer in either part of the circuit.

In accordance with one embodiment of the invention, a plurality of self-saturating reactor circuits are interconnected to form a bridge circuit having two sections responsive in opposite directions to a given signal, and discharging directly into a common load without requiring an electrical center in the input power source or in the output circuit of the amplifier.

In connection with magnetic push-pull amplifiers, it has been the general practice to arrange the biasing system of such amplifiers so that the bias windings of each opposing side of the amplifier operating on both halves of the A. C. cycle are connected and adjusted as one circuit. One of the features of the present invention is a biasing system wherein only the sections of both push-pull halves of the amplifier which operate on the same half wave are linked and adjusted by a common bias circuit which may be varied by a single control to balance the parts of the amplifier operable on the same half wave.

It is therefore an object of this invention to provide a new and useful magnetic amplifier having an output with polarity and amplitude that will vary in accordance with the polarity and amplitude of an impressed signal.

It is a further object of this invention to provide a new and useful magnetic amplifier whose output is a function of the sense and amplitude of an impressed signal, that is, the polarity and amplitude, or the phase and amplitude of the signal.

Another object of this invention is to provide a new and useful magnetic amplifier which does not require an electrical center in either output or power input circuit, and which can deliver directly to a useful load, without necessity of auxiliary voltage dropping resistances, an output current whose polarity and amplitude will vary in accordance with the sense and amplitude of the signal impressed on its signal input.

A further object of this invention is to provide a new and useful bias system for magnetic push-pull amplifiers.

Further objects and advantages of the present invention will be apparent from the following description, reference being had to the accompanying drawings wherein a preferred form of the present invention is clearly shown.

Figure 1:
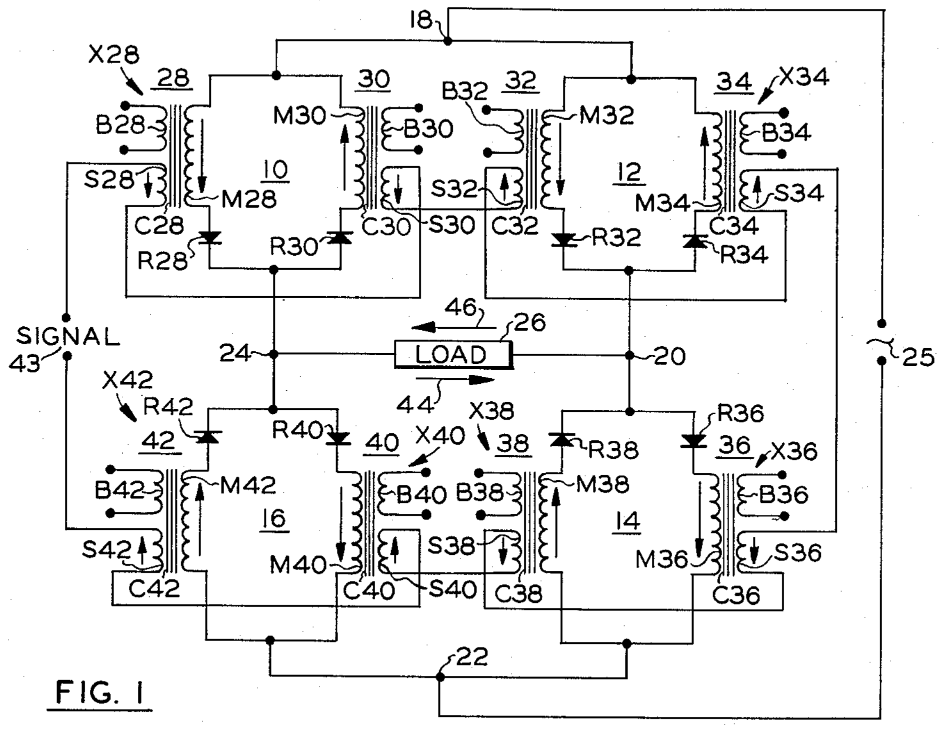
Figure 1 is a circuit diagram of one embodiment of the invention.

One embodiment of the invention shown in Figure 1 has the form of a bridge with four arms 10, 12, 14, and 16 connected by conjugate points 18, 20, 22, and 24. The conjugate point 18 joins the adjacent arms 10 and 12; point 20 joins the adjacent arms 12 and 14; point 22 joins the adjacent arms 14 and 16; and point 24 joins the adjacent arms 16 and 10. Points 18 and 22 constitute the power input of the amplifier and are connected to a source of alternating current 25. Points 20 and 24 are the output of the amplifier and are shown connected to a useful load 26, such as an indicator, a generator field, the input of another amplifier, etc.

Each of the arms 10, 12, 14, and 16 has a pair of self-saturating magnetic amplifier branches connected in parallel, for example, branches 28 and 30 in arm 10, adapted to pass currents in opposite phase with respect to each other. The other pairs of branches are as follows: 32 and 34 of arm 12, 36 and 38 of arm 14, and 40 and 42 of arm 16. Each of the branches includes the customary elements of a self-saturating reactor circuit, a main winding M of a reactor X, and a one-way valve or half wave rectifier R, the main winding being connected in series with the rectifier R, and also being inductively coupled to a saturable core C and to signal and bias windings S and B, respectively. In Figure 1 the components of each branch carry the branch number prefixed by the letter representing the part. For example, branch 28 includes a main winding M28 of a saturable reactor X28 having a core C28, and bias and signal windings B28 and S28, respectively. The main winding M28 is connected in series with a one-way valve or rectifier R28 that is electrically oriented in reverse relation with respect to the other rectifier R30 in the other branch 30 of the same arm 10. Thus, the branches 28 and 30 are oppositely phased in that they can conduct only in fixed opposite directions. Likewise, the pairs of branches in each of the other arms are oppositely phased.

Arms 10 and 14 are considered as opposite arms of the bridge as also are arms 12 and 16 with respect to each other. The other relation between the arms of the circuit is "adjacent arms" of which the following are examples: arms 10 and 12 are adjacent arms, and arms 10 and 16 are also adjacent arms.

As herein before noted, each branch is a self-saturating reactor circuit whose individual operation is well known. In any branch, for example branch 28, current will pass in one direction only and in half-wave pulses due to the rectifier R28, and the amount of current which may pass is determined by the inductance of the main winding M28, which in turn is governed by the permeability of the core C28. To control the output of the main winding, it is necessary to control its reactance which may be done by controlling the degree and time of magnetic saturation in the core. The reactance of the main winding is at a minimum and its output at a maximum when the residual magnetism or flux density of its associated core section during the nonconducting part of the cycle is at a maximum, and conversely the reactance is at a maximum and the main winding output at a minimum when the residual flux axis is translated downward to negative values. A working point at or between the two extremes may be obtained by inherent design of the apparatus or by biasing the reactor core with a fixed value of magnetomotive force to either aid or oppose the main winding magnetomotive force, depending on the working point chosen, which in turn is dependent upon the particular use of the amplifier and the maximum current drain tolerated at the quiescent signal. Thus, with a fixed particular working point or magntic condition of the core, the main winding, on the conducting portion of the rectifying cycle, will allow an output of some substantially fixed value which may be zero or greater.

Signal currents may be used to generate magnetomotive force to aid or oppose the main winding magnetomotive force, thereby to increase or decrease the reactance of the main winding in dependence on the direction of the signal magnetomotive force, which in turn is dependent on the sense of the signal, i. e., its polarity or phase. Signal magnetomotive force in the saturating or aiding direction will reduce the reactance and boost the output, while signal magnetomotive force in the opposing or de-saturating direction will tend to increase the reactance and buck the output of the main winding. The strength of the signal will, of course, determine the degree of change in reactance.

To avoid confusing detail, the connections to the bias windings B are not shown in Figure 1. Each bias winding B may be connected to a source of properly polarized or phased current, such as pure D. C., rectified A. C., or A. C. All the signal windings may be connected in series with each other and the signal source 43, as in Figure 1, so that the same current flows through all the coils. However, all the signal windings are not poled to affect the main winding magnetomotive force of their associated cores in the same manner. The signal windings are arranged so that the amplifier has two push-pull sections, wherein signal magnetomotive force will aid main winding magnetomotive force in one section while opposing it in the other section. When the impedance of each branch is the same, their independent current outputs, which could be zero or greater, will be the same, and the current through the load 26 will be zero because there will be no potential difference across the load. It will be appreciated that the average load current can be made zero with either zero signal current, or any predetermined value and sense of signal current, by inherently symmetrical components, or by obtaining the proper balance with appropriate magnetic biasing of the reactor cores.

Branches 28, 34, 36, and 42 constitute one side of the amplifier. These branches, in a conducting state, pass current through the load 26 in one direction if all the other branches are in a state of relatively low or non-conduction. The other branches 30, 32, 38, and 40 constitute the opposing side of the amplifier and these branches will, when conductive, pass current through the load 26 in the other direction if the other branches are in either a relatively low or non-conducting state.

The amplifier may be further divided into four sections, each containing two branches operable on the same half cycle to conduct current through the load 26 in a fixed direction, depending upon the electrical orientation of their respective rectifiers, when other branches are in either a relatively low or non-conducting state.

Each section is composed of two of the aforementioned branches in series with the load 26, one branch being coupled to one end of the load, the other branch being connected to the opposite end of the load. For example, branches 28 and 36 constitute a section and are adapted to pass current through the load in the direction of the arrow 44 during one-half of the A. C. cycle, if it is arbitrarily assumed that the rectifiers conduct in the direction of the arrowhead portion of the rectifier symbol when that portion is at a positive potential. Likewise, branches 34 and 42 constitute a section and are adapted to pass current through the load 26 in the direction of the arrow 44 on the opposite half wave, i. e., other half of the A. C. cycle. Branches 32 and 40 are adapted to pass current through the load 26 in the direction of the arrow 46 during one-half cycle, and branches 30 and 38 are adapted to pass current through the load in the same direction, arrow 46, on the other half-cycle.

Thus, there are two opposing sections operable on one half-wave, each adapted under controlled conditions to cause load current to flow in a different direction, and there are two opposing sections operable on the other half wave, each adapted under controlled conditions to cause load current to flow in a different direction.

It will be seen that raising the output of certain sections while bucking the output of other sections will direct a current through the load in one direction during either half of the A. C. cycle. Reversing the action on the respective sections will reverse the current flow through the load. The increase or the decrease of the output of any one branch may be effected, as hereinbefore described, by suitably polarized signal currents inducing magnetomotive force in the associated cores. The divisibility in sections is taken advantage of in the embodiment shown in Figure 3, and hereinafter more fully described.

In order that the current in the load 26 may be a unidirectional current whose polarity will follow the polarity of the input signal applied to the signal circuit, the signal coils S may be connected in series with each other and the signal source, with the direction of the independent signal windings being such that signal generated magnetomotive force will affect the main winding magnetomotive force in one way in branches 28, 34, 36, and 42, while affecting the main winding magnetomotive force of branches 30, 32, 38, and 40 in the opposite way.

This is illustrated in Figure 1 by the relative directions of the arrows adjacent to the main windings and to the signal windings, which arrows indicate the directions of the magnetomotive force due to the main windings and the signal windings, respectively. The relation illustrated is for a signal of given polarity and is interpreted as follows: In branches 28, 34, 36, and 42, the signal magnetomotive forces are indicated as aiding the main winding magnetomotive forces and boosting the output of the reactors in these branches while in the other branches 30, 32, 38, and 40 the signal magnetomotive forces are opposing the main winding magnetomotive forces and bucking the outputs of their reactors. As a result, the outputs of the reactors 28, 34, 36, and 42 are increased while the outputs of the other reactors are suppressed or decreased, and the current will flow through the load 26 in the direction of the arrow 44. As the signal reverses in polarity, the signal magnetomotive force will reverse as will also the current through the load. The cores may, if desired, be so biased that the output current in the load will reverse as the signal passes through a predetermined value other than zero, for example, the cores may be biased to reverse the load current as the signal passes through .5 ampere from above or below that value. This indicates that .5 ampere is the quiescent signal, i. e., the signal at which load current is zero.

If an A. C. output into the load is desired, the direction and relation of the signal windings should be such that branches 28, 30, 36, and 38 are affected in one direction by a given signal while the branches 32, 34, 40, and 42 are affected in the opposite manner by the same signal. For example, if a given signal produces magnetomotive force aiding the main winding magnetomotive force in reactors X28, X30, X36, and X38, the same signal will produce magnetomotive force opposing the main winding magnetomotive force in the reactors X32, X34, X40, and X42, and vice versa.

Figure 2:
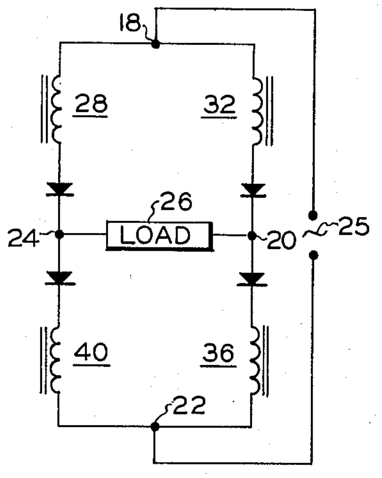
Figure 2 is a circuit diagram of an amplifier utilizing a half wave of the alternating current power supply.

It is possible to obtain half-wave direct current in the load by utilizing only two opposing sections operable on one half wave and formed from branches 28, 32, 36, and 40. A diagram of such a circuit, less bias and signal coils, is shown in Figure 2. This circuit shall be referred to herein as a half-wave bridge. The signal windings for this circuit should be such that signal generated magnetomotive force will affect the main winding magnetomotive force of branches 28 and 36 in one direction while the signal magnetomotive force will affect the main winding magnetomotive force in branches 32 and 40 in the opposite direction, for example, when magnetomotive force due to a given signal aid the main winding magnetomotive force of branches 28 and 36, they will oppose the main winding magnetomotive force in branches 32 and 40, the reverse being true with a reversed signal. A reverse in signal current will reverse the load current. Thus two opposing sections, one formed from branches 28 and 36 and the other formed from branches 32 and 40, operate on one half wave only, and each is operable to direct current through the load in a different direction.

An inspection of the circuit of Figure 1 will show that it includes two of the circuits like the circuit of Figure 2 connected in parallel with respect to all conjugate points, but oppositely phased. This is demonstrated by the diagram in Figure 3 wherein the bridge made of branches 28, 32, 40, and 36 operates on one half wave, and is connected in parallel with the bridge made of branches 30, 34, 42, and 38 which operates on the opposite or other half wave of the A. C. power cycle. Thus, the circuits of Figure 1 and Figure 3 can be resolved into two symmetrical oppositely phased reactor controlled half wave bridges operable on opposite half cycles and connected across the load in parallel with each other.

Figure 4:
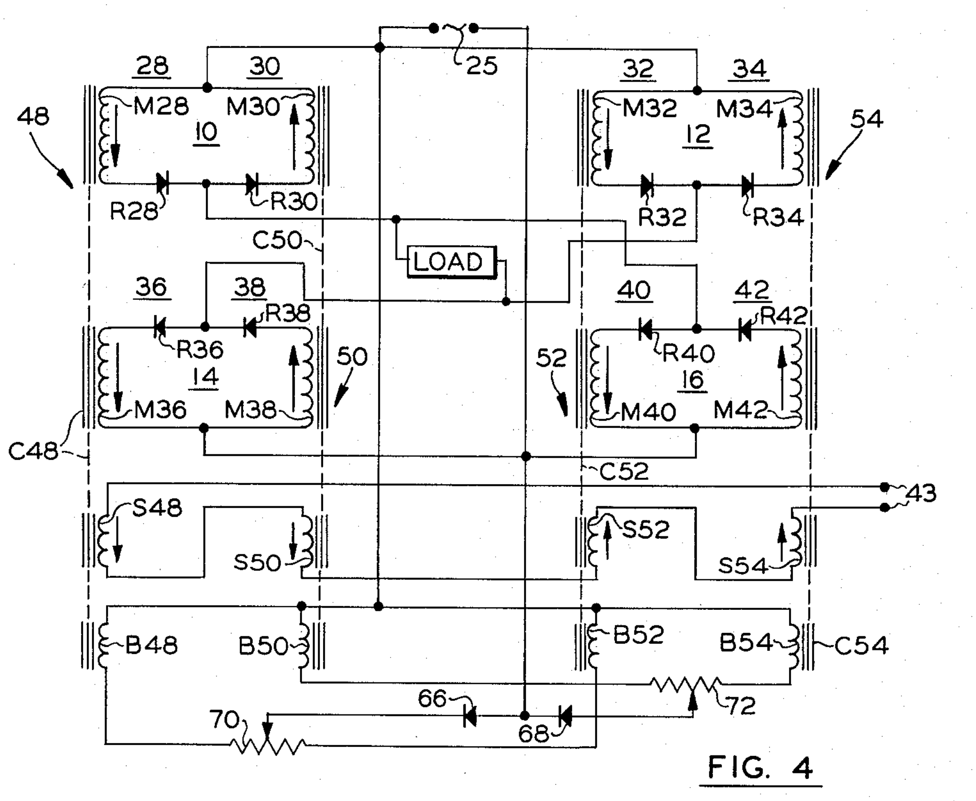
Figure 4 is similar to the basic circuit of Figure 1 but using fewer cores, each accommodating more than one main reactor winding. This figure also illustrates a novel bias circuit.

Although separate reactor cores are indicated for each branch in Figure 1, certain of the main windings, signal windings, and bias windings may be grouped on common cores as illustrated in Figure 4. The main windings of Figure 1 are equivalent to the main windings carrying the same reference numerals in Figure 4, and it will be seen that each of the hereinbefore referred to sets of two main windings operating together are carried on the same reactor core. In the latter figure, four reactors 48, 50, 52, and 54 are employed, each carrying main windings of two different branches of the circuit operating as one section of the push-pull amplifier, for example, reactor 48 includes a suitable saturable core C48 which carries main windings M28 and M36, a single signal winding S48, and a single bias winding B48. The other reactors 50, 52, and 54 carry the same complement of windings as reactor 48.

In reactor 50, main windings M30 and M38, a signal winding S50 and a bias winding B50 are mounted on a core C50. Reactor 52 includes a core C52, main windings M32 and M40, a signal winding S52, and a bias winding B52. Main windings M34 and M42 are carried by the core C54 of the reactor 54, which also includes signal and bias windings S54 and B54, respectively.

The main windings and their respective companion rectifiers of the circuit in Figure 1 appear in the same relation in Figure 4. The same arm and branch network of Figure 1 is also utilized in Figure 4 and is indicated by the same indicia. With respect to each reactor, the output of both main windings carried by the reactor will be similarly affected by a given signal current through the single signal winding.

The signal windings of the separate reactors are connected in series with each other and with the signal source 43. For D. C. output into the load, the signal windings are poled so that a given signal will affect reactors 48 and 54 in one direction while reactors 50 and 52 will be affected in the opposite different direction. For example, a given signal will increase the output of reactors 48 and 54 while decreasing the output of reactors 50 and 52 as indicated by the relative directions of the magnetomotive force arrows placed adjacent to their associated windings in the figure. Upon reversal of the signal, the output of reactors 50 and 52 would increase while that of reactors 48 and 54 would tend to decrease, and the current through the load would be reversed. For A. C. output in the load 26, reactors 48 and 50 are paired against reactors 52 and 54, that is, in one pair the output goes up while the output goes down in the other pair in response to a given signal.

Although full wave direct current or alternating current may be used in the biasing system of Figure 4, the embodiment shown utilizes half wave direct current derived from the A. C. supply 25 through half wave rectifiers 66 and 68. It is essential that in each reactor the biasing half wave occurs during the non-conducting half cycle of the reactor's main windings. Its polarity is chosen according to the desired result, opposing or aiding the main winding magnetomotive force, i. e., bucking or boosting the reactor output.

The bias system in Figure 4 is unique in itself in that it provides separate balancing, bias circuits for each group of reactors operating during the same phase but in opposite sections of the push-pull amplifier. If the performance of all similar circuit components in the various branches would be identical, zero output in the load would coincide with quiescent input. The bias determines the quiescent reactor currents for zero load output. However, in practice it is difficult to obtain electrical symmetry by inherent design. In order to balance out individual differences of circuit components due to variations in material and manufacture, separate current dividing controls permit adjustment of bias currents in each set of two reactors working during the same phase or half cycle. The bias windings of the reactors 48 and 52 which work during the same half cycle, and in opposing sections of the push-pull amplifier, may be inversely affected with respect to each other by the bias control 70 which, when adjusted in one direction, tends to lower the output of one reactor while raising that of the other, the reverse being true when the control is adjusted in the opposite direction. Likewise, the current in the bias windings of reactors 50 and 54 may be inversely controlled by the control 72. Thus the amplifier may be balanced to obtain zero load current in response to the quiescent signal by balancing between components operating in one phase first, then balancing the components operating during the opposite phase, i. e., on the other half of the A. C. cycle.

Figures 5, 6, 7:
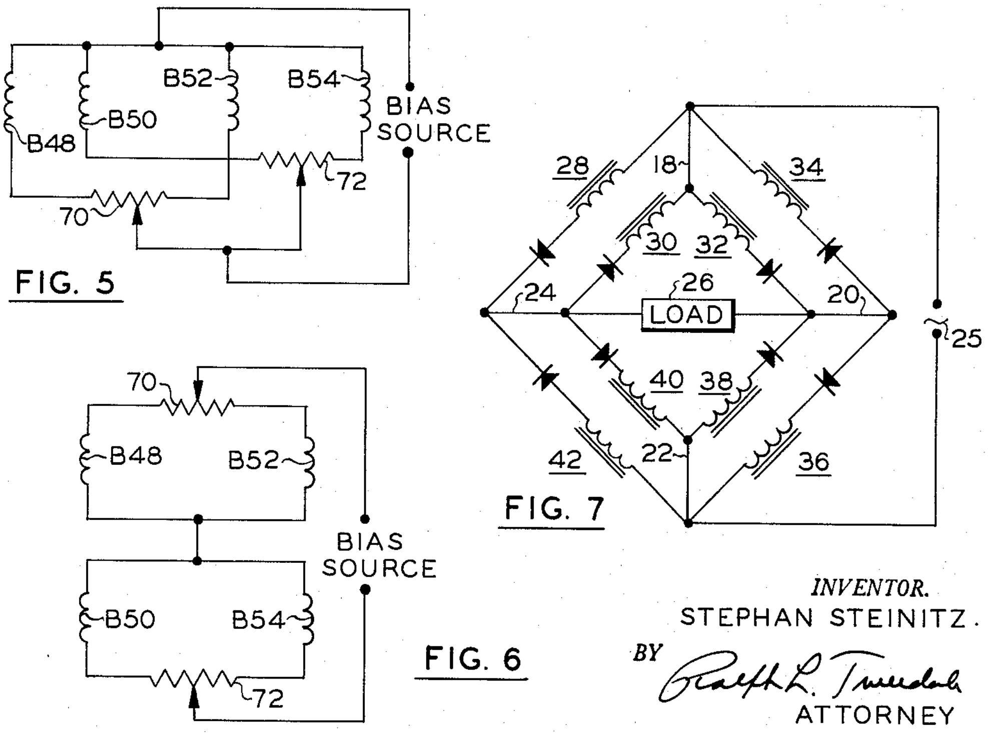
Figures 5 and 6 are different versions of biasing circuits incorporating features of the invention.
Figure 7 is a geometric rearrangement of the basic circuits of Figures 1, 3, and 4.

Figures 5 and 6 are variations of the bias system, both suitable for A. C. or D. C. bias current. However, the polarity of the bias windings is generally not the same for both A. C. and D. C., and consequently the coil symbols in Figures 5 and 6 are not necessarily indicative of their polarities or relative winding directions. Any of the variations of divided bias systems shown in Figures 5 and 6 may be used in connection with the amplifier circuit of Figure 4, or in other push-pull magnetic amplifiers. The same reference numerals are applied to the bias windings in Figures 4, 5, and 6 to indicate the possible interchange of the biasing system in the circuit of Figure 4. From Figures 5 and 6 it will be seen that the bias windings of each group of reactors operating on the same half cycle, but in opposite sections of the push-pull amplifier, are fed in parallel from the supply source, A. C. or D. C., through a variable divider which is adapted, upon adjustment, to divide the bias current between the two windings in an inverse relation. For example, bias windings B48 and B52 are fed in parallel through the divider 70 which may be adjusted to inversely change the division of the bias current between the two windings. The circuit of Figure 6 draws less current than that of Figure 5 because the two parallel sets are connected in series while the two parallel sets of Figure 5 are connected in parallel to the bias supply. In the case of an amplifier having a plurality of reactors operating in the same sections of a push-pull amplifier during the same half-cycle, each of the bias windings of Figures 4, 5, and 6 may be taken to symbolically represent the interconnected bias windings of such plurality of reactors.

Figure 3:
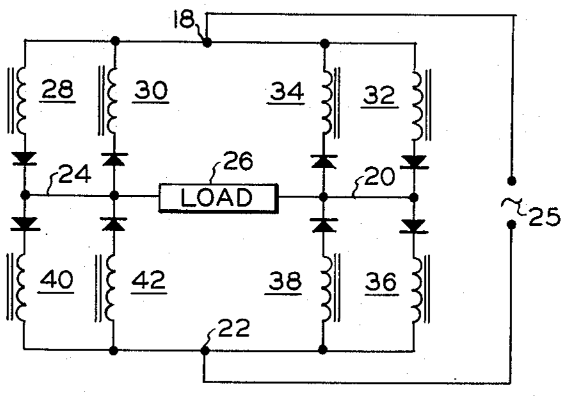
Figure 3 is a rearranged skeleton diagram of the circuit of Figure 1.

Figure 7 shows a geometrical rearrangement of the basic amplifier circuit of Figures 1, 3, and 4 which makes more apparent certain significant relations. Signal and bais windings are not shown to avoid confusing detail. From this figure it is readily seen that two Graetz full-wave rectifier bridges are connected in parallel, but reversely poled at all the conjugate points. Branches 28, 34, 36, and 42 constitute one Graetz full-wave bridge while branches 30, 32, 38, and 40 form the other Graetz bridge. At each of the conjugate points 18, 20, 22, and 24, the electrical geometry of the adjacent branches of one bridge is the reverse of that of the other bridge. For example, at the point 18 the relation of the rectifiers in branches 28 and 34 are the reverse of those of the rectifiers in branches 30 and 32, respectively. Likewise, at the conjugate point 24 the orientation of the rectifiers in branches 28 and 42 is opposite to that of the rectifiers in branches 30 and 40.

All the bridge circuits described herein are Wheatstone bridges in that they all include four impedance arms or branches with the power input across opposite conjugate points, and the output across the other two opposite conjugate points. However, in a standard Wheatstone bridge, the branches are not inherently directional as they are in the circuits of the present invention wherein a rectifier in each branch fixes the current direction of the branch. The amplitude and direction of current in the output is dependent upon the areas of unbalance and the degree of unbalance of impedances.

The various circuit components, such as reactors, reactor cores, rectifiers, etc. have been shown diagrammatically and are intended to be symbolic of the various suitable forms known in the art to which the invention relates.

As disclosed herein, each main winding may be mounted on a core individual to it, or, any suitable arrangement for mounting a plurality of main windings on a common core may be utilized. Where a plurality of main windings are mounted on a common core, the composite has been referred to as a reactor, such as reactor 48 in Figure 4. However, it will be appreciated that each main winding, in association with the common core, may be correctly considered a separate reactor. Thus in the appended claims, the term reactor is equally applicable to a main winding in association with an individual core or with a core common to a plurality of main windings connected in different branches. For example, a reactor in one branch and a reactor in another branch may be separate main windings on separate cores, or they may be mounted on a common core and still be termed and referred to individually as reactors.

While the form of embodiment of the invention as herein disclosed constitutes a preferred form, it is to be understood that other forms might be adopted, all coming within the scope of the claims which follow.

What is claimed is as follows:

1. A magnetic amplifier having a load, a pair of opposing sections operable on one half wave, a pair of opposing sections operable on the other half wave, each section having signal responsive reactors in series with and on both sides of said load, and a bias system comprising a separate bias circuit for each pair of opposing sections, each bias circuit including a bias control adapted upon adjustment to increase the bias current in one section while simultaneously reducing the bias current in the opposing section operable on the same half wave, said bias circuits being connected together to be energized from a common source and in such manner that adjustment of said control for one pair of opposed sections is independent of the bias ratio between the other pair of opposing sections.

2. A magnetic amplifier comprising a load, a signal responsive reactor controlled half wave bridge having an output connected across said load, a second signal responsive reactor controlled half wave bridge having an output connected across said load, the bridges being connected in opposite phase with respect to each other, and a bias system comprising a separate bias circuit for each bridge, said bias circuits being connected together for energization from a common source, each bias circuit including parallel connected bias windings in adjacent arms of the bridge and a common bias control adapted upon adjustment to increase the bias current in one arm of the bridge while simultaneously decreasing the bias current in an adjacent arm of the bridge, the bias adjustment for one bridge being independent of the bias ratio between adjacent arms of the other bridge.

3. In a magnetic amplifier, a load, a reactor controlled half wave Wheatstone bridge having an output connected across said load, a second reactor controlled half wave Wheatstone bridge having an output connected across said load, each of said bridges being operable on a different half wave of an alternating current cycle, and a bias system comprising a bias circuit for each bridge, said bias circuits being connected together for energization from a common source, each bias circuit including parallel connected bias windings in adjacent arms of the bridge and a common bias control for simultaneously increasing the bias current in one arm of the bridge while decreasing the bias current in an adjacent arm of the bridge, the bias adjustment in one bridge being independent of the bias ratio between adjacent arms of the other bridge.

4. A magnetic amplifier comprising a load, a first section operable on one half cycle of an alternating current to pass current through the load in one direction, a second section operable on the same half cycle to pass current through the load in the opposite direction, a third section operable on the other half cycle of said alternating current to pass current through the load in said one direction, a fourth section operable on said other half cycle to pass current through the load in said opposite direction, each section comprising a pair of reactor controlled branches connected to both ends of and in series with the load, a signal circuit for affecting, in response to a signal of given polarity, the output of two of said sections in one manner while affecting the output of the other two sections in the opposite manner, and a bias system comprising a separate bias circuit for each pair of sections operable on the same half cycle, said bias circuits being connected together to be energized from a common source, each bias circuit comprising a bias control adapted upon adjustment to vary the bias inversely in opposing sections operable on the same half cycle independently of the bias ratio applied to the opposing sections operable on the other half cycle.

5. A magnetic amplifier comprising a load, a first section operable on one half cycle of an alternating current to pass current through the load in one direction, a second section operable on the same half cycle to pass current through the load in the opposite direction, a third section operable on the other half cycle of said alternating current to pass current through the load in said one direction, a fourth section operable on said other half cycle to pass current through the load in said opposite direction, each section including a pair of reactor controlled branches in series with the load, one branch being connected on each side of the load, each of said branches comprising a rectifier and a saturable reactor having a main winding in circuit with the rectifier, a signal circuit for boosting the output of two of said sections while bucking the output of the other two sections in response to a given signal, and a bias system comprising a separate bias circuit for each pair of sections operable on the same half cycle, said bias circuits being connected together to be energized from a common source, each bias circuit comprising a bias control adapted upon adjustment to vary the bias inversely in opposing sections operable on the same half cycle independently of the bias ratio applied to the opposing sections operable on the other half cycle.

6. In a push-pull magnetic amplifier which has a first set of opposing reactor controlled sections operable on a half wave of an alternating current cycle, and a second set of opposing reactor controlled sections operable on the opposite half wave of said alternating current cycle, a bias system comprising a separate bias circuit for each of said sets, said bias circuits being connected together to be energized together from a common source, each bias circuit comprising a bias control adapted upon adjustment to vary the bias inversely in opposing sections of the set independently of the other bias circuit, said bias circuits being connected together in such manner that adjustment of the control in one set does not disturb the bias ratio in the other set.

7. In a push-pull magnetic amplifier having a first set of opposing reactor controlled sections operable on a half wave of an alternating current cycle, a second set of opposing reactor controlled sections operable on the opposite half wave of said alternating current cycle, a bias system comprising a separate bias circuit for each of said sets, said bias circuits being connected in series to be energized together from a common source, each bias circuit comprising a bias control and separate bias windings for the opposing sections in the set, said separate windings in the set being connected in parallel through said bias control, said control being adapted upon adjustment to vary the bias inversely in opposing sections of the set without affecting the bias current ratio between the opposing sections of the other set.

8. In a push-pull magnetic amplifier which has a first set of opposing reactor controlled sections operable on a half wave of an alternating current cycle, and a second set of opposing reactor controlled sections operable on the opposite half wave of said alternating current cycle, a bias system comprising a separate bias circuit for each of said sets, said separate bias circuits being connected together in parallel to be energized together from a common source, each bias circuit comprising a bias current control and separate bias windings for the opposing sections in the set, said separate windings in the set being connected in parallel through said current bias control, said control being adapted upon adjustment to vary the bias current inversely in the bias windings of the opposing sections of the set without affecting the bias current ratio between the opposing sections of the other set.

References Cited in the file of this patent

UNITED STATES PATENTS

| | | |
|---|---|---|
| 2,509,738 | Lord | May 30, 1950 |
| 2,509,864 | Hedstrom | May 30, 1950 |
| 2,552,952 | Gachet et al. | May 15, 1951 |
| 2,622,239 | Bracutt | Dec. 16, 1952 |

FOREIGN PATENTS

| | | |
|---|---|---|
| 233,014 | Switzerland | Oct. 2, 1944 |
| 233,962 | Switzerland | Dec. 1, 1944 |

OTHER REFERENCES

"Magnetic Amplifiers of the Balance Detector Type, Their Basic Principles, Characteristics, and Applications," by W. A. Geyger, AIE Miscellaneous paper 50–93, published December 1949.